United States Patent [19]

Fritz

[11] 4,392,406
[45] Jul. 12, 1983

[54] SWITCHED CAPACITOR SINE WAVE GENERATOR AND KEYER

[75] Inventor: Gary R. Fritz, Ferdinand, Ind.

[73] Assignee: Kimball International, Inc., Jasper, Ind.

[21] Appl. No.: 275,984

[22] Filed: Jun. 22, 1981

[51] Int. Cl.³ .............................................. G10H 1/02
[52] U.S. Cl. ..................................... 84/1.26; 84/1.13
[58] Field of Search ............... 84/1.26, 1.13, DIG. 91, 84/1.01

[56] References Cited

U.S. PATENT DOCUMENTS

| | | | |
|---|---|---|---|
| 3,515,792 | 6/1970 | Deutsch | 84/1.03 |
| 3,657,657 | 4/1972 | Jefferson | 328/14 |
| 3,974,461 | 8/1976 | Luce | 84/DIG. 9 |
| 4,133,241 | 1/1979 | Niimi et al. | 84/1.01 |
| 4,175,465 | 11/1979 | Schmoll | 84/1.26 |
| 4,205,581 | 6/1980 | Robinson | 84/1.26 |
| 4,205,582 | 6/1980 | Howell et al. | 84/1.26 |
| 4,296,663 | 10/1981 | Chibana | 84/1.26 |
| 4,367,670 | 1/1983 | Howell et al. | 84/1.13 |

OTHER PUBLICATIONS

G. M. Jacobs, G. F. Landsburg and B. J. White, Touch-Tone Decoder Chip Mates Analog Filters with Digital Logic, Feb. 15, 1979, pp. 105–112, Electronics.

Primary Examiner—J. V. Truhe
Assistant Examiner—Forester W. Isen
Attorney, Agent, or Firm—Albert L. Jeffers; John F. Hoffman

[57] ABSTRACT

The invention relates to a circuit for synthesizing either simple or complex waveforms of the type used in electronic musical instruments, such as electronic organs. In the specific embodiment disclosed herein, the synthesizing circuit is utilized in a rhythm unit for producing a damped sine wave charateristic of certain drum sounds. Opposite polarity waveforms are simultaneously produced by a switched capacitor technique driven by an attack/decay clocking signal and under the control of a keying signal received from a suitable low frequency rhythm clock source. The positive and negative waveforms are alternately selected in order to produce bipolar pulses at the frequency of the desired tone, and these pulses are connected to the input of a switched capacitor filter that modifies the pulses to produce a sine wave signal having an amplitude following that of the desired damped envelope. The individual sine wave cycles are produced by generating a plurality of increments wherein each increment comprises a plurality of discrete amplitude steps. The stepped waveform is then filtered by a second switched capacitor filter that is tracked to the frequency which drives the sine wave generation portion of the circuit. The system is particularly adapted for large scale integration requiring no external capacitors and no external tone generating source. A wide variety of waveforms can be generated by the technique of the present invention, and the waveforms can be keyed from a keyboard, an automatic rhythm unit or other control signal within the instrument.

33 Claims, 13 Drawing Figures

Fig. 3

Fig. 9a  $\overline{RC}$
Fig. 9b  RHY ROM INSTRUMENT
Fig. 9c  STROBE

Fig. 9d  ATTACK / DECAY CONTROL

Fig. 9e  ENVELOPE OF ∿ KEYER ENV. GENERATOR

SWITCHED CAPACITOR SINE WAVE GENERATOR AND KEYER

BACKGROUND OF THE INVENTION

The present invention relates to an electronic musical instrument, and in particular to a waveform synthesizing circuit for both producing the synthesized waveform and keying it with the desired envelope.

At the present time, drum sounds, such as bass drums, congas, and the like, are simulated in electronic organs by driving a ringing oscillator with a pulse input. A ringing oscillator is basically a high Q filter or underdamped oscillator, and when it is excited by a pulse input, it rings or oscillates for a brief period of time. The output of this type of circuit is essentially a damped sinusoid waveform having a relatively fast attack and a more gradual decay and having a duration appropriate to the particular rhythm instrument being simulated.

The problem with this type of circuit is that if the Q is set too high, the circuit will become less damped and will tend to oscillate. The sound produced by circuits of this type sound more pleasing when the Q is set as high as possible, and as long as the circuit elements remain within tolerance and are not subjected to excessive temperature conditions, the circuit will perform satisfactorily. As the circuit element tolerance changes and temperature conditions vary, however, the circuit can drift into an oscillatory condition, which produces a very unpleasing howling or humming sound. In order to avoid this condition, most damped sine wave circuits of this type are set to be damped more than is desirable to obtain an optimum sound and the simulation of the percussion instruments in question is correspondingly affected. A further problem is that the circuits are generally made of discrete components which vary from unit to unit and the sound character produced by the units will not be uniform.

Another prior art circuit employed to produce certain percussion sounds comprises generating a square wave in synchronism with a pulse from the rhythm unit counter or ROM output, and a square wave signal is then appropriately filtered to produce a damped sine wave. Difficulty with this type of circuit is that, depending on when the leading edge of the pulse from the rhythm unit occurs in relation to the square wave pulse train, a different sound will be produced. The differences in resultant sound occur primarily to differences in the attack portion of the waveform, which is a function of the relationship between the rhythm pulse and the square wave pulse train.

Although the particular embodiment of the present invention disclosed hereinafter is a circuit for producing a damped sine wave suitable for use in the production of certain drum and other percussion instrument sounds, the invention also relates to other types of waveforms, such as reeds, violins and the like.

Typically, the tones produced by an electronic musical instrument are initially generated by a tone generator, which produces a plurality of tones spanning the entire range of the musical instrument. These tones are then connected to the tone inputs of individual keyers that have control inputs adapted to receive keying signals initiated by depressing keys of the keyboard or from an automatic easy play feature, such as a musical rhythm accompaniment system. The keying signals are often in the form of long duration pulses that are appropriately filtered to impart exponential-type attack and decay leading and trailing portions. The keying signals directly control the amplitude of the tones keyed by the keyers, and by varying the attack and decay characteristics, a wide variety of percussive and sustain-type instruments can be simulated.

A second type of tone generation and keying, which is commonly referred to as digital tone synthesis, comprises storing in a memory a digital representation of the actual waveshape. The digitized and stored waveshape is then read out repetitiously at a particular frequency and converted to analog form to produce the musical note, with the rate at which the waveshape is read out determining the frequency of the resultant tone. Attack and decay are controlled digitally, as by the addition and subtraction of scaling factors.

Both in the keyed oscillator and digital synthesis techniques for tone generation, it is necessary to key the tone to the output with an attack and decay appropriate to the particular instrument being simulated. Although the keying in the digital synthesis technique is usually handled by a pure digital technique, the keyed oscillator systems have often relied on percussive and sustain envelope generators wherein external RC timing circuits are employed. To avoid the necessity for external discrete elements, switched capacitor techniques have been used to produce the keying envelope wherein a pair of alternately switched electronic switches having a capacitor connected to their juncture incrementally transfer the voltage from the input to the output. The advantage to the switched capacitor technique is that it can be fully integrated thereby avoiding the necessity for external timing capacitors. The use of such a circuit in a sustain-type keyer is disclosed in U.S. Pat. No. 4,205,581, and a percussion-type keyer utilizing this technique is disclosed in U.S. Pat. No. 4,205,582. Each of these two patents is expressly incorporated herein by reference.

SUMMARY OF THE INVENTION

The present invention relates to a waveform synthesis system wherein both the waveform amplitude envelope and the waveform itself are generated by a switched capacitor technique. This permits the entire circuit to be completely integrated with the pulse or DC level keying signal being connected to a control input and one or more clocking signals connected to the respective clocking inputs for driving the switched capacitor filters.

Rather than storing the waveform in a memory as in the prior art digital synthesis techniques, the waveform is produced by filtering a series of amplitude steps through a switched capacitor filter and controlling the clocking frequency of the filter to produce waveform segments having varying slopes. Thus, either simple or very complex waveforms can be generated totally internally of the chip and without the necessity for a separate tone input.

The specific embodiment of the invention disclosed comprises a circuit for generating a damped sine wave signal characteristic of certain percussion instruments, such as drums and clave. The control input comprises a DC level shift, such as a pulse, making a transition from one voltage level to another during attack and then making the opposite transition during decay. This DC level change is converted to a pair of envelope waveforms having the appropriate exponential attack portions by means of a first pair of switched capacitor filters. The filters are driven by an attack clock during the attack portion and by a decay clock during the sustain portion, and a positive going envelope and a negative going envelope are produced.

A chopping circuit alternately selects the positive going and negative going envelopes to produce a series of bipolar pulses having amplitudes which follow the amplitudes of the envelopes and which have a frequency equal to the chopping frequency. This signal is then passed through a second switched capacitor filter having a variable frequency clocking input. The amplitude of each pulse is incrementally transferred from the input to the output of the second switched capacitor filter to produce a plurality of discrete amplitude steps generally following the amplitudes of the individual pulses but having a shape dictated by the frequency at which the second filter is clocked.

The waveform generating filter produces the waveform corresponding to each pulse in a plurality of segments wherein the aforementioned discrete steps for each segment are produced at a rate dictated by the clocking frequency. By varying the clocking frequency, the duration of each step can be altered so that the rate of change of slope of each segment is controlled. This permits each half cycle of the resultant waveform to be incrementally synthesized, and since the controlling pulses are bipolar, the same frequency relationship is used for the negative half of the sine wave.

The resultant sine wave will have an amplitude that varies with the keying envelope produced by the first-mentioned pair of switched capacitor filters and will comprise a plurality of discrete amplitude steps. A smoothing filter, which is also of the switched capacitor type, smooths out the waveform to produce a conventional damped sinusoid wave. The smoothing filter is clocked by the same clocking frequency used to generate the sine wave so that the filter will track the frequency of the tone being produced.

As indicated earlier, the circuit according to the present invention can be utilized to produce a wide variety of different wave shapes, even those which are continuously keyed from the keyboard. The "musical waveform" which is produced may be a conventional tone such as a violin, flute, piano and the like, or a percussion instrument such as a drum or clave. The circuit is intended to be completely integrated thereby avoiding the necessity for a separate rhythm unit, as is typical in most prior art electronic organs.

Specifically, the present invention relates to a waveform and envelope generation circuit for an electronic musical instrument comprising means for producing a keying signal for calling forth a desired musical waveform, and an envelope generator responsive to the keying signal for producing on an output an envelope waveform. The envelope generator includes an input connected to the keying signal and an output and charge pump means for incrementally transferring voltage on the input to the output under the control of a first clocking signal. A tone generator having an input operatively connected to the envelope generator is responsive to the envelope waveform and produces a cyclic musical waveform having an envelope following the envelope waveform. The tone generator comprises a charge pump means for repetitively and incrementally generating a complete cycle of the musical waveform under the control of a second clocking signal wherein each cycle of the musical waveform has an amplitude determined by the envelope waveform.

In accordance with another aspect of the invention, the envelope generator produces a series of pulses having respective amplitudes that follow a time varying envelope, and the tone generator incrementally transfers the amplitude of each pulse to its output under the control of its clocking signal whereby the pulse at the input of the tone generator is shaped into a portion of a musical waveform and the amplitude of the musical waveform generally follows the time varying envelope.

The invention also relates to a method for producing a tone of a desired frequency and having a given amplitude envelope comprising generating a keying signal, and incrementally producing a time varying envelope waveform in response to the keying signal wherein the envelope signal comprises a plurality of amplitude steps collectively following the given amplitude envelope. A musical waveform is produced in response to the steps of the envelope waveform by incrementally generating a plurality of musical waveform amplitude steps in response to each step of the envelope waveform, and the resultant musical waveform comprises a plurality of cycles wherein each cycle comprises a plurality of discrete amplitude steps. The discrete amplitude steps in the musical waveform are subsequently smoothed by a filter.

It is an object of the present invention to provide a tone synthesizing system wherein both the keying envelope and the waveform itself are generated internally without the necessity for an external tone generator of keying envelope.

It is a further object of the present invention to provide a tone synthesizing and keying system that is capable of being completely integrated without any external timing capacitors.

A still further object of the present invention is to provide a tone synthesizing and keying circuit that does not require a memory to store the resultant waveform and the attack and decay scaling factors.

These and other objects and features of the present invention will become apparent from the detailed description, taken together with the accompanying drawings.

DETAILED DESCRIPTION

Figure 1:
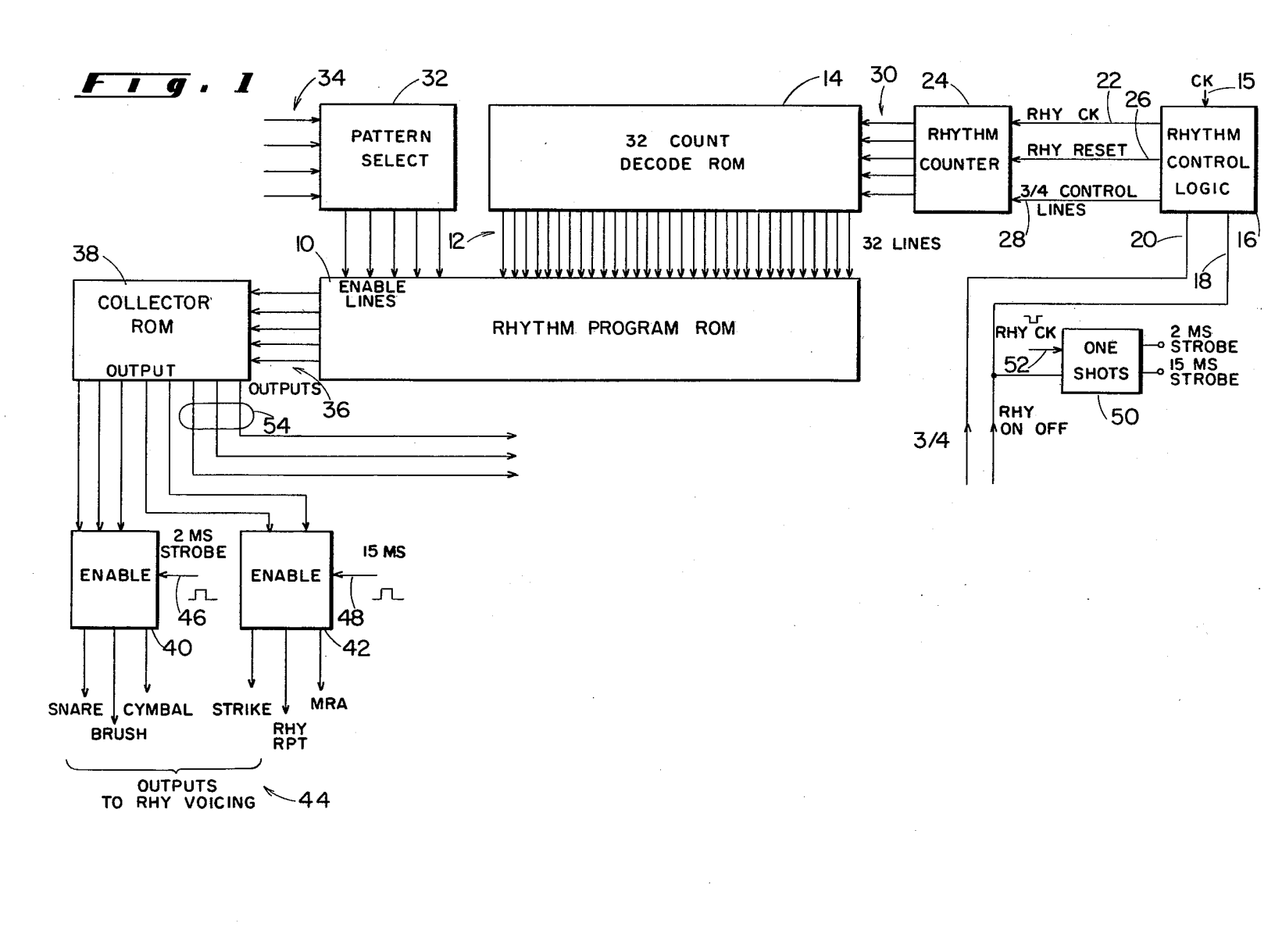
FIG. 1 is a block diagram of a portion of an electronic organ including rhythm control system circuitry.
Figures 9A, 9B, 9C, 9D:
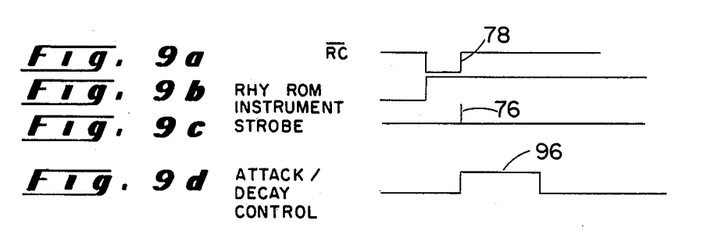
FIGS. 9A-9E are diagrams of certain waveforms produced by the system.

Referring now in detail to the drawings, FIG. 1 illustrates a fairly conventional rhythm programming section comprising a rhythm program read only memory 10 addressed by the outputs 12 of read only memory 14, wherein the thirty-two parallel lines of ROM 10 are sequentially addressed by the respective thirty-two input lines 12. The clock train for addressing ROM 10 is connected over input 15 to the rhythm control logic block 16, which receives a rhythm on/off control signal on line 18 and a ¾ pattern control on line 20. Rhythm control logic block 16 is conventional in operation and produces on output 22 a low frequency rhythm clock train, the inversion of which is illustrated in FIG. 9A. The rhythm clock train on line 22 drives counter 24, and counter 24 also receives a rhythm reset control on line 26 and the ¾ control on line 28, the latter causing counter 24 to delete certain counts if a ¾ pattern is selected.

Counter 24 produces on outputs 30 a plurality of five bit binary words which are decoded by ROM 14 to thereby sequentially activate the output lines 12 as described above. Pattern select ROM 32, which is controlled by a four bit binary word on inputs 34, selects one of the patterns stored in ROM 10, and output pulses appear on the instrument output lines 36 for certain of the rhythm instruments, such as the snare drum, brush, and cymbal and other control pulses such as strike, rhythm repeat and musical rhythm accompaniment. Collector ROM 38 collects the outputs from rhythm program ROM 10, and enable blocks 40 and 42 produce the appropriate rhythm output pulses on outputs 44 when they are strobed by strobe pulses on inputs 46 and 48. The strobe pulses on lines 46 and 48 are generated by one shots 50 enabled by the rhythm on/off signal on line 18 and the rhythm clock signal on line 52.

Three additional outputs 54 from collector ROM 38 pertain to primarily drum-type rhythm voices, such as a bass drum, low conga and high conga. The output on one of lines 54 is shown in FIG. 9B in response to the activation of that particular line in ROM 10 for the patterns selected. Line 54 is connected to one of the inputs of AND gate 56 (FIG. 2) and the other input 58 is connected to the output of monostable 60, which is clocked by the rhythm clock pulse train on line 62. Strobe circuit 64 comprising NOR flip-flop 66 and D-type flip-flops 68, 70 and 72, produces an instrument strobe pulse on output line 74, and as shown in FIGS. 9A and 9C, this strobe pulse 76 coincides with the trailing edge of the rhythm clock pulse 78.

Figure 2:
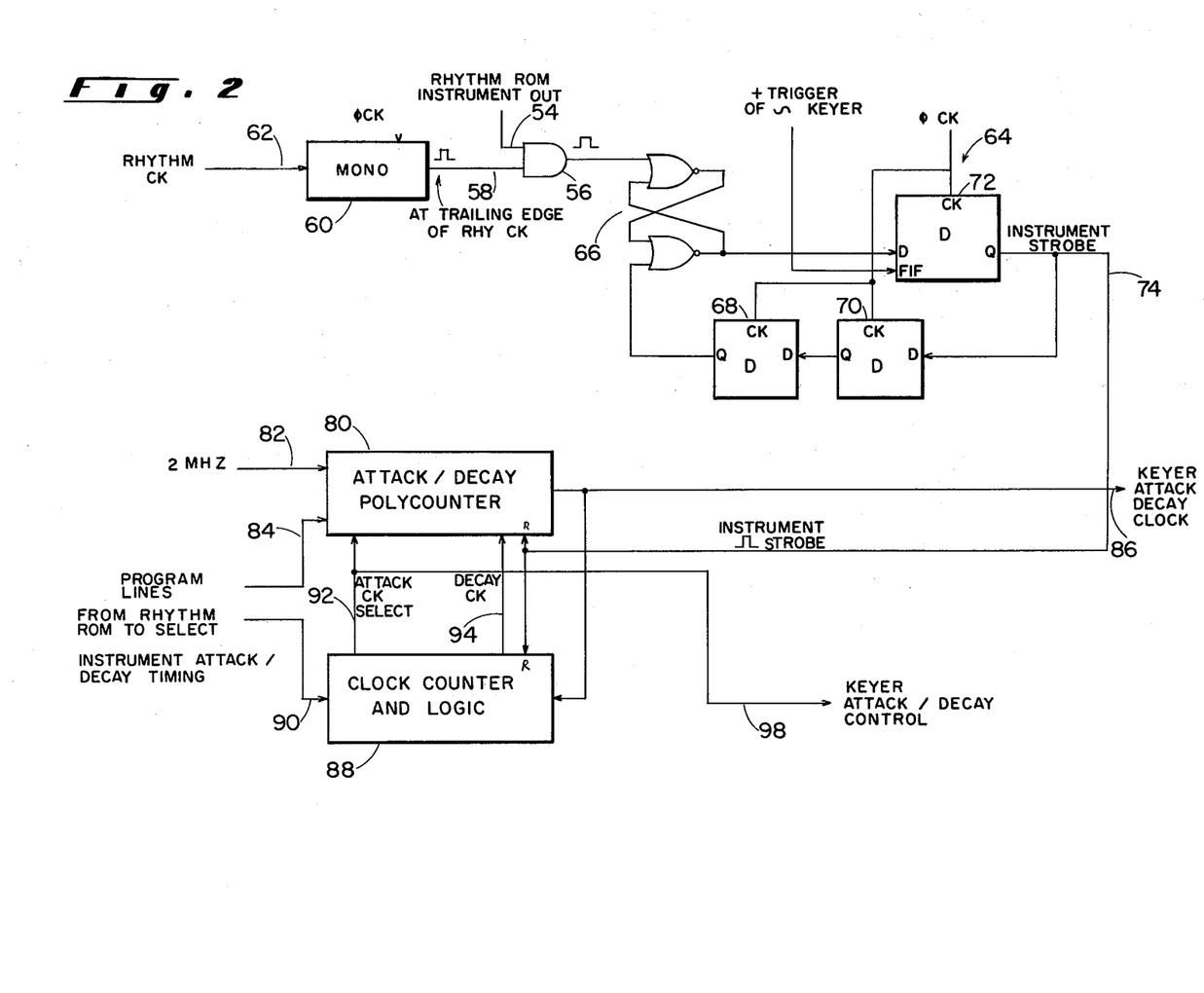
FIG. 2 is a block diagram of the keyer control and clock generating circuit.

The control circuitry of FIG. 2 comprises an attack-/decay polynomial counter 80 of conventional design and clocked by the two megahertz clocking signal on line 82. Polynomial counter 80 is reset by the instrument strobe pulse on line 74 and its divide counts are selected in a conventional fashion by program lines 84 to produce an output line 86 a clock train having the desired frequency. Lines 84 are selected according to the particular instrument channel to which the tone synthesizer in question pertains so that the attack and decay clock signals will have the appropriate frequency. As discussed earlier, the switched capacitor type technique used for generating the amplitude envelope is controlled by the frequency at which it is clocked, and if a particular instrument requires a longer attack or sustain, for example, polynomial counter 80 would be programmed to produce a clocking train on line 86 having a lower frequency. If a faster sustain or attack is required, then the outputs of counter 80 would be decoded to produce a clocking train having a higher frequency. Decode control lines 84 may be factory set or, in the case where the particular rhythm channel can be employed for producing more than one rhythm instrument, they would be programmed depending on the pattern selected through pattern select ROM 32.

The control circuitry of FIG. 2 also includes a clock counter and logic block 88 having control inputs 90, which perform basically the same function as inputs 84, and outputs 92 and 94 connected to polynominal counter 80. Output 92 causes counter 80 to produce an attack clock signal on line 86 during the attack portion of the keying signal, and output 94 programs counter 80 to produce a decay clock signal on line 86 during the decay portion. The output on line 92 is a pulse 96 illustrated in FIG. 9D, which initiates during the occurrence of strobe 76 and terminates an interval of time later depending on the programming selected by line 90. Attack/decay control pulse 96 is connected to the tone synthesizer and keyer circuit of FIG. 3 over line 98. Basically, the attack/decay control pulse 96 on line 98 is simply a rhythmically occurring pulse on the rhythm instrument channel in question which occurs each time the instrument, such as a bass drum, is to be sounded. Depending on the particular instrument, the pulse 96 may be wider or narrower. As an alternative to the circuitry of FIG. 2, the activating pulse for the rhythm unit could be produced by conventional rhythm unit circuitry with pulse stretching techniques utilized to produce the proper pulse width. In the system disclosed, however, multiple use is obtained from the circuitry and is therefore more efficient from a chip usage standpoint. For example, the same polynomial counter 80 is utilized to generate the attack and decay pulse trains on line 86 in an alternating fashion, and because counter 80 is fully programmable, the rhythm channel can be programmed for more than one rhythm instrument.

Figure 3:
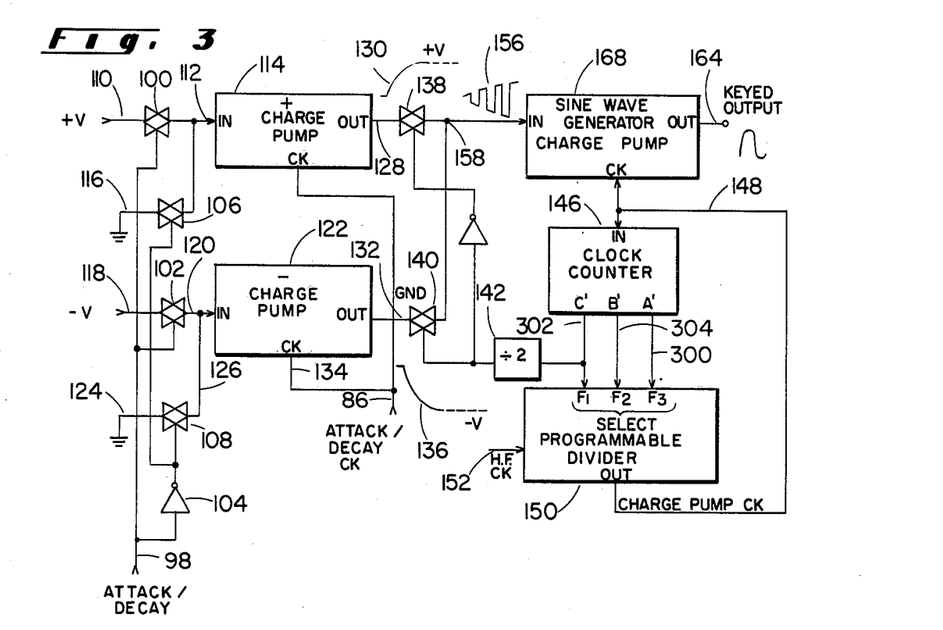
FIG. 3 is a block diagram of the tone synthesizer and keyer of the present invention.

Referring now to FIG. 3, the tone synthesis and amplitude envelope generation circuit of the present invention will be described. The attack and decay control signal 96 (FIG. 9D) is connected to the control gates of conventional bidirectional transmission gates 100 and 102 and through inverter 104 to the control terminals of similar bidirectional transmission gates 106 and 108. Transmission gates 100, 102, 106 and 108 are completely conventional in nature and may comprise, for example, field effect transistors. The input 110 of gate 100 is connected to a positive DC voltage, such as plus five volts, and its output is connected to the input 112 of charge pump circuit 114. The input 116 of transmission gate 106 is connected to ground potential and its output is also connected to the input of charge pump circuit 114. The input 118 of transmission gate 102 is connected to a negative DC voltage, such as minus 5 v., and its output 120 is connected to the input of a second charge pump circuit 122. The input 124 of transmission gate 108 is connected to ground potential and its output 126 is also connected to the input of charge pump 122.

When the attack/decay control signal on line 98 goes to a logic 1, transmission gates 100 and 102 are rendered conductive so that the positive and negative voltage inputs, respectively, are connected to the inputs of charge pumps 114 and 122. At the same time, inverter 104 causes gates 108 and 106 to be disabled. When the attack/decay control pulse 96 on line 98 goes back to a logic 0 thereby initiating decay, gates 100 and 102 are disabled and gates 106 and 108 are rendered conductive so that ground potential is applied to the inputs 112 and 120 of charge pumps 114 and 122.

Charge pumps 114 and 122, which will be described in detail hereinafter, are clocked by the same clock train on line 86, which clock train is either the attack frequency or the decay frequency, depending on the control of counter 80 (FIG. 2). Charge pump 114 incrementally transfers the positive voltage on input 112 to its output 128 as it is clocked, and the output waveform 130 is illustrated in FIG. 3. As will be seen, the waveform makes a transition from ground potential to the positive voltage level on its input in an exponential fashion and in a plurality of discrete amplitude steps. Similarly, charge pump 122 incrementally transfers the negative voltage on its input 120 to its output 132 as it is clocked by the pulse train on its clocking input 134. The output waveform 136 is illustrated in FIG. 3 and it will be seen. to make a transition between ground potential to the negative voltage potential in an exponential fashion and then hold at the negative voltage until the initiation of decay. Like waveform 130 waveform 136 comprises a plurality of discrete amplitude steps characteristic of charge pump outputs. Charge pumps 114 and 122 are basically of the type disclosed in the aforementioned U.S. Pat. No. 4,205,581.

An additional pair of transmission gates 138 and 140 are alternately enabled by the output from divider 142, which is driven by the F1 select output 302 of clock counter 146. Counter 146 is clocked by the clock signal on line 148 from programmable divider 150, which is driven by the high frequency clock train on line 152. Due to the action of the divided output of programmable divider 150, gates 138 and 140 are alternately rendered conductive so that the positive and negative outputs 130 and 136, respectively, of charge pumps 114 and 122 are selected in an alternating fashion. This produces a series of bipolar pulses 156 at the juncture 158 of transmission gates 138 and 140. As will be seen, the amplitudes of the individual pulses increase with time in accordance with the envelopes 130 and 136.

Figure 9E:
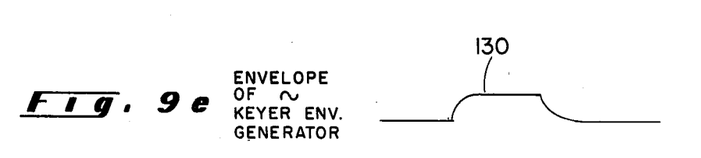

When the attack/decay control pulse 96 returns to logic 0, transmission gates 100 and 102 will be disabled and gates 106 and 108 enabled so that the ground potential on the inputs 112 and 120 of charge pumps 114 and 122 will be incrementally transferred to their outputs 128 and 132 in an exponential fashion. FIG. 9E illustrates the output wave shape 130 of charge pump 114.

The chopped output 156 of charge pumps 114 and 122 is connected to the input of sine wave generator charge pump 168, which is clocked by the pulse train on line 148 from the output of programmable divider 150. Programmable divider 150 produces three different output frequencies on line 148 depending on the frequency select line 302, 304 or 300 which is activated. Clock counter 146, which is clocked by the output 148 of programmable divider 150 counts a predetermined number of frequency F1 outputs from divider 150 then activates the frequency F3 select line 300 and counts a predetermined number of F3 frequency pulses, and then activates line 304 and counts a predetermined number of F2 pulses before reactivating line 302, which again selects the F1 pulse output from programmable divider 150.

Figure 7:
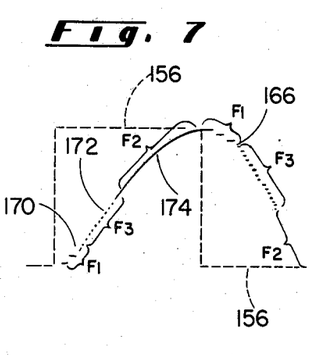
FIG. 7 is a diagram of a half cycle of the stepped sine wave signal.

Charge pump 168 incrementally transfers the amplitude peaks of each of the pulses in the chopped envelope waveform 156 to its output 164 to produce the waveform 166 illustrated in FIG. 7. Clock counter 146 selects the lowest frequency F1 for two steps as illustrated in FIG. 7, then selects the next highest frequency F3, which is four times the frequency of F1 for fifteen steps to produce the intermediate portion of waveform 166, and then selects F2, which is the highest frequency eight times as great as F1, for the final forty-five steps of the waveform. As will be seen from FIG. 7, as F1, F3, and F2 are selected, the shape of the respective segments 170, 172 and 174 will change. Specifically, the relative magnitudes of the rates of change of slope, that is, the values without regard to whether the slopes are positive or negative, of the segments 170, 172 and 174 are different, and the lengths of the segments differ as well. The net result of these three segments is exactly one half cycle of a sine wave making the transition from the most negative peak to the most positive peak.

What has been done is to utilize the charge pump technique to incrementally transfer the positive amplitude of the positive going pulses 156 to the output 164 in three segments wherein the clocking frequency for the three segments is varied depending on the wave shape desired. In a similar fashion, the negative amplitudes of the negative going pulses 156 are also transferred incrementally by cycling through the F1, F3 and F2 frequencies. Of course, if waveforms other than a sine wave are desired, the number of segments and the respective frequencies for them would be varied accordingly. The actual frequency utilized will depend on the type of tones which are desired, but the abovedescribed step and frequency relationship between the three segments in question has been found satisfactory for a damped sine wave simulating a drum. As will be noted, the frequencies for producing the steps of waveform 166 have a direct relationship to the frequency utilized for chopping the envelope output 130, and this last frequency is determinative of the frequency of the sine wave tone. Accordingly, once the frequency of the desired tone is determined, the other frequencies can easily be selected.

Figure 8:
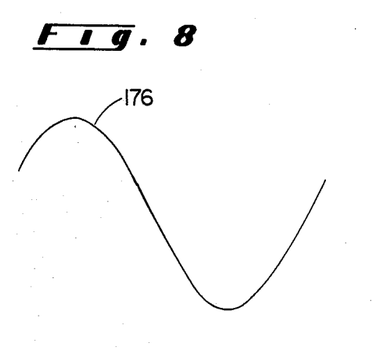
FIG. 8 is a diagram of one full cycle of the filtered sine wave.

The output 164 of sine wave generator 168 is then connected to a switched capacitor filter for smoothing out the steps of waveform 166 thereby producing the conventional sine wave 176 illustrated in FIG. 8.

Figure 4:
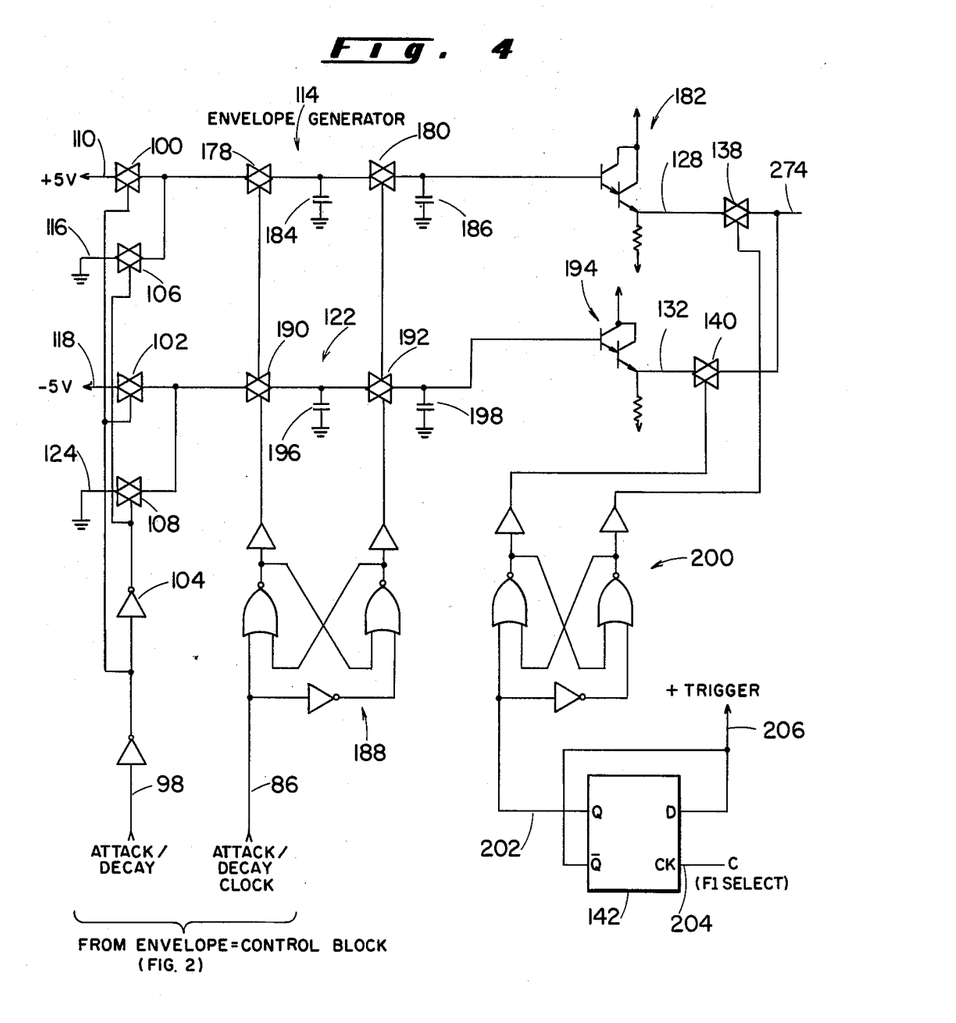
FIGS. 4, 5 and 6 together form a detailed circuit schematic of the tone synthesizer and keyer.
Figure 5:
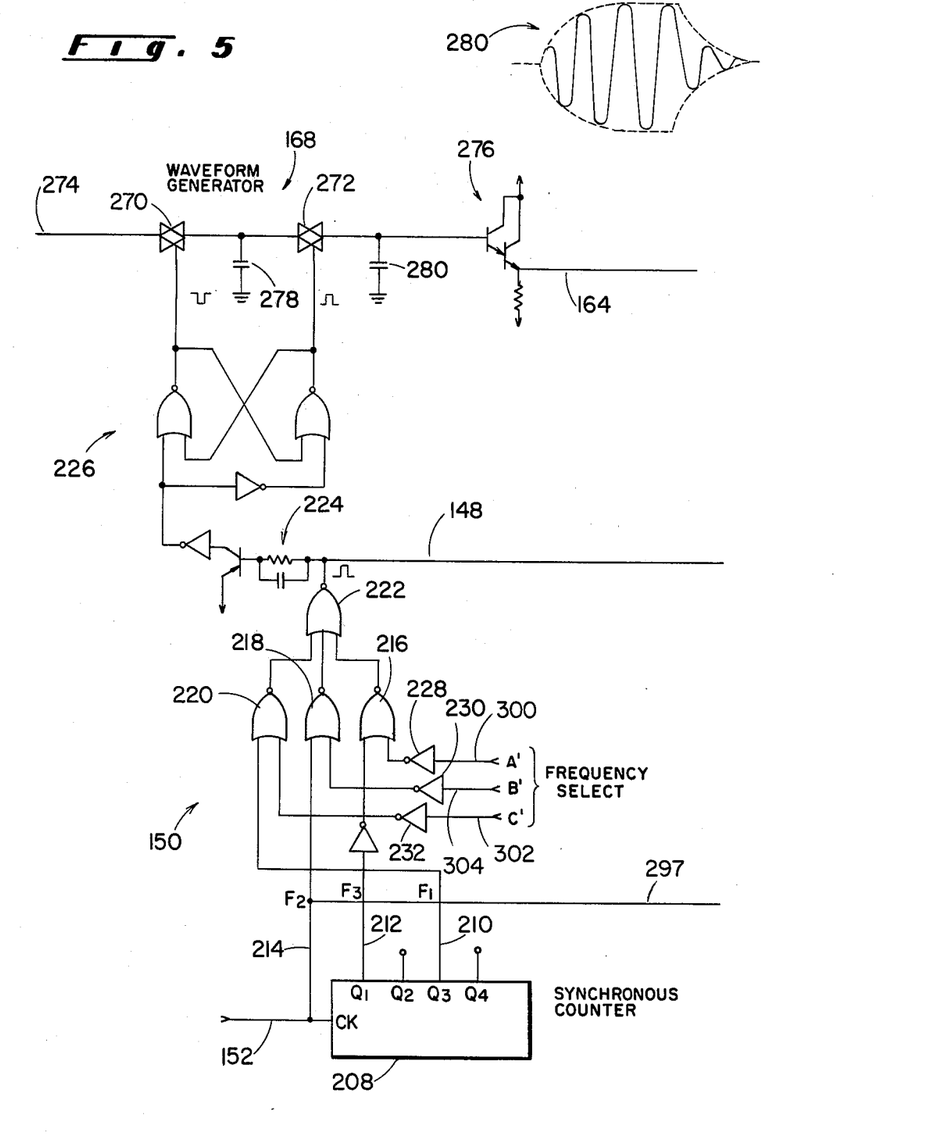
Figure 6:
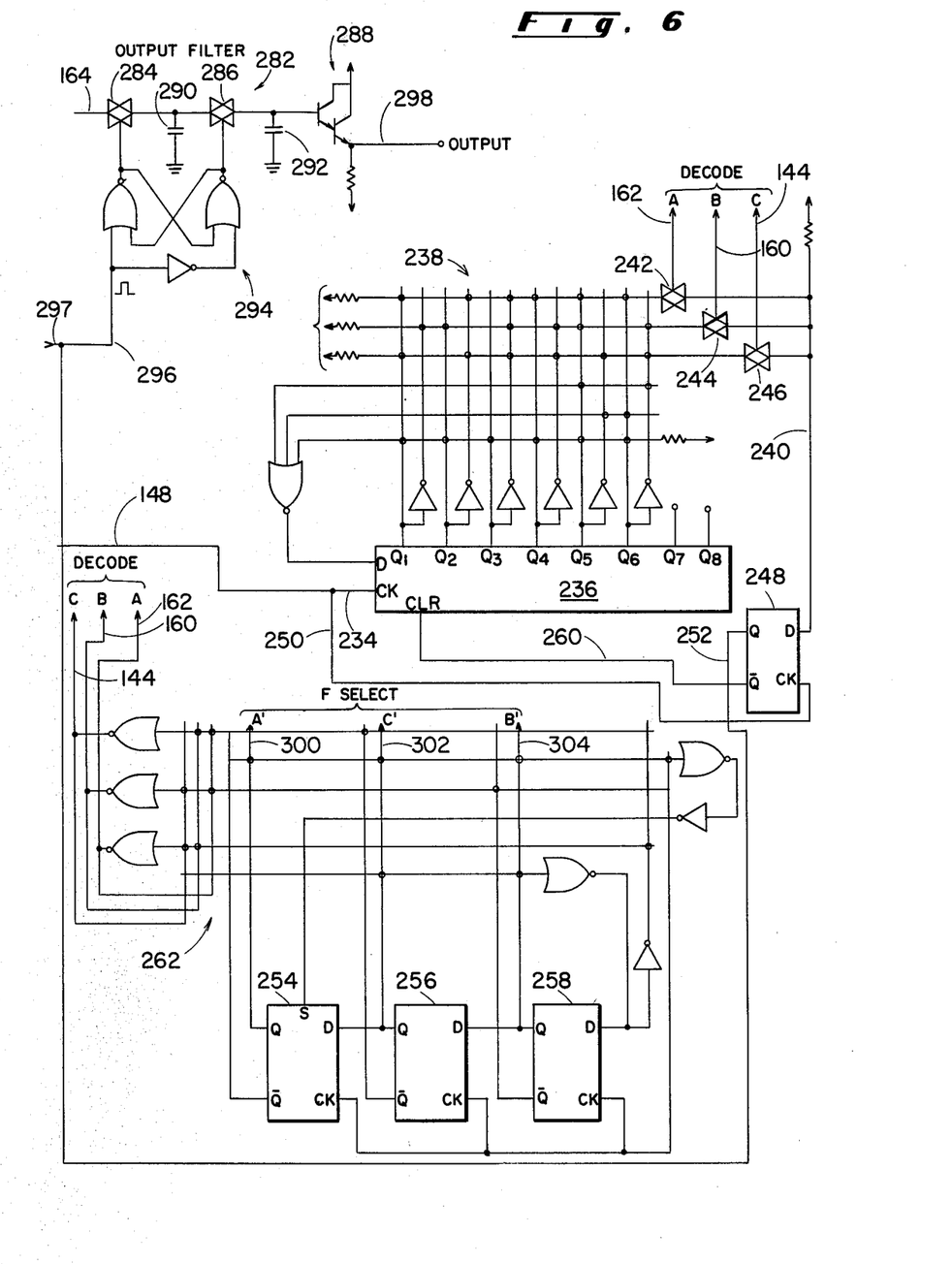

Referring now to FIGS. 4, 5 and 6, the details of the circuitry will be described. As discussed earlier, the outputs of transmission gates 100, 106, 102 and 108 are connected to the inputs of charge pumps 114 and 122. Charge pump 114 comprises a pair of bidirectional transmission gates 178 and 180 connected in series with each other and in series with the output of transmission gate 100 and the input of emitter-follower 182. A 0.001 microfarad capacitor 184 is connected between the juncture of transmission gates 178 and 180 and ground, and a 0.082 microfarad capacitor 186 is connected to the output of transmission gate 180 and ground potential. Transmission gates 178 and 180 are rendered conductive alternately by NOR RS flip-flop 188, which is driven by the attack or decay clock train on line 86. As described in detail on the aforementioned U.S. Pat. No. 4,205,581, charge pump 114 incrementally transfers the voltage level on the output of transmission gate 100 to the input of emitter-follower 182 as a plurality of discrete amplitude steps which generally follow an exponential pattern. If gate 100 is enabled, this causes a transition from ground potential to a potential of positive five volts, and if gate 106 is enabled, this results in a transition from the previous level of positive five volts to ground potential, as illustrated in FIG. 9E.

Charge pump 122 for the negative portion of the envelope comprises bidirectional transmission gates 190 and 192, which are connected in series with each other and with the output of transmission gates 102 and 108 and the input of emitter-follower 194. A 0.001 microfarad capacitor 196 is connected between the juncture of gates 190 and 192 and ground potential, and a second 0.082 microfarad capacitor 198 is connected between the output of transmission gate 92 and the ground.

Gates 190 and 192 are similarly rendered alternately conductive by RS flip-flop 188 and function to incrementally transfer either the negative five volt input or the ground potential input to gate 190 to the input of emitter-follower 194.

Transmission gates 138 and 140 are rendered alternately conductive by RS flip-flop 200, which is driven by the Q output 202 of D-type flip-flop 142. Flip-flop 142 is driven by the F1 select signal on clocking input 204. A positive trigger signal is developed from the Q output on line 206. As discussed earlier, gates 138 and 140 function to produce a series of bipolar pulses at the desired sine wave output frequency wherein the amplitudes of the respective pulses generally follow the amplitudes of the keying envelopes 130 and 136.

Referring now to FIGS. 5 and 6, synchronous counter 208 of the aforementioned programmable divider 150 is driven by the high frequency clock train on line 152 and produces a low frequency F1 on output 210, an intermediate frequency F3 on output 212 and the highest frequency F2 appears on line 214. Outputs 210, 212 and 214 are connected to one of the inputs of NOR gates 216, 218 and 220, respectively, the outputs of which are summed by NOR gate 222 and fed through transistor buffer and invertor circuit 224 to RS flip-flop 226. The other input of NOR gate 216 is connected through inverter 228 to input line 300, the other input of NOR gate 218 is connected through inverter 230 to frequency select line 304, and the other input of NOR gate 220 is connected through inverter 232 to frequency select line 302.

As shown in FIG. 6, the selected frequency on line 148 is connected to the clocking input 234 of 74164 polynominal counter 236, the outputs of which are decoded by decoder matrix 238. Matrix 238 decodes the outputs of polynomial counter 236 to count either the F3, F2 or F1 pulse train on line 148 and produce a decode pulse on line 240, depending on whether transmission gate 242, transmission gate 244 or transmission gate 246 is enabled by the decode inputs on lines 162, 160 or 144, respectively. This decode pulse is connected to the D input of flip-flop 248, which is clocked by the clock train on line 250 connected over line 148 to the output of the frequency select circuit illustrated in FIG. 5. The Q output 252 of flip-flop 248 is connected to the clocking inputs of D-type flip-flops 254, 256, and 258, and the Q output is connected over line 260 to the clear input of polynomial counter 236. The outputs of flip-flops 254, 256 and 258 are decoded by matrix 262 to produce on lines 144, 160 and 162 the F1, F2 and F3 decode signals. These lines are connected to the control terminals of transmission gates 242, 244 and 246 in FIG. 6. The Q outputs of flip-flops 254, 256 and 258 produce on lines 300, 302 and 304 the F1, F2 and F3 select signals. These lines are connected to the inputs of invertors 228, 232 and 230 in FIG. 5.

The above circuitry functions to clock the sine waveform generator 168 at three successive frequencies for each of the pulses 156, whether positive going or negative going. The frequency at which the charge pump 168 is clocked is determined by the frequency select signals on lines 300, 302 and 304, and the number of steps for each segment at the respective frequency as determined by the decode outputs 144, 160 and 162 of flip-flop 254, 256 and 258.

Sine wave charge pump 168 comprises a pair of bidirectional transmission gates 270 and 272, which are connected in series with each other and in series between the combined outputs 274 of transmission gates 138 and 140 (FIG. 4) and the input of emitter-follower 276. A 100 picofarad capacitor 278 is connected between the juncture of transmission gates 270 and 272 and ground potential, and a 0.0022 microfarad capacitor 280 is connected between the output of transmission gate 272 and ground. Transmission gates 270 and 272 are alternately rendered conductive by RS flipflop 226 which, as has been described above, is driven by the selected frequency from the outputs of type 40161 synchronous counter 208.

Charge pump 168 functions to incrementally transfer the voltage peaks for both the positive going and negative going pulses 156 to the output in a plurality of discrete amplitude steps wherein the initial segment beginning with either the most negative or most positive peak comprises two steps, the next segment comprises fifteen steps at a frequency four times as high, and the final segment extending to the next peak of the cycle comprises forty-five steps at a frequency eight times as high as the frequency for the first two steps. The resultant waveform 280 has the shape shown above output line 164 in FIG. 5, which is typical of a conventional damped sine wave. Although not evident from FIG. 5, the sine wave comprises a plurality of discrete amplitude steps as illustrated in FIG. 7. The resultant segments have changing slopes that change at different rates to provide the desired waveform.

Output line 164 is connected to smoothing filter 282, which comprises a pair of bidirectional transmission gates 284 and 286 connected in series with each other and in series between output lines 164 and the input of emitter-follower 288. A 100 picofarad capacitor 290 is connected between the juncture of transmission gates 284 and 286 and ground potential, and a 0.0082 microfarad capacitor 292 is connected between the output of gate 286 and ground. Gates 284 and 286 are alternately rendered conductive by RS flip-flop 294 which is driven by the pulse train on line 296 connected to the F2 line 214 by line 297, which is the clocking frequency on line 152.

Output filter 282 is a smoothing filter which functions to eliminate the discrete steps in the output waveform 280 and produce the smooth sinusoidal waveform illustrated in FIG. 8. Since filter 282 is clocked by a frequency that is related to the frequencies used for generating the sine wave output from waveform generator 168 (FIG. 5), filter 282 tracks the frequency of the waveform in question, a condition which is particularly desirable when filtering sine waves.

The output 298 from emitter-follower 288 carries the filtered sine wave, and this output may be connected to additional voicing circuitry or to the output amplifiers for the organ.

While this invention has been described as having a preferred design, it will be understood that it is capable of further modification. This application is, therefore, intended to cover any variations, uses, or adaptations of the invention following the general principles thereof and including such departures from the present disclosure as come within known or customary practice in the art to which this invention pertains and fall within the limits of the appended claims.

What is claimed is:

1. In an electronic musical instrument, a waveform and envelope generation circuit comprising:

means for producing a keying signal for calling forth a desired musical waveform, said keying signal comprising a DC voltage level, envelope generator means responsive to said keying signal for producing on an output an envelope waveform, said envelope generator means having an input connected to said keying signal and an output and charge pump means for incrementally transferring the DC voltage level on said input to said output as a plurality of increasing or decreasing discrete amplitude levels under the control of a first clocking signal connected to said envelope generator means, said charge pump means including a charge storing means for accumulating discrete units of charge to produce said discrete amplitude levels, tone generator means having an input operatively connected to the envelope generator means output and responsive to the envelope waveform for producing on a further output a cyclic musical waveform having an envelope following the envelope waveform, said tone generator means comprising second charge pump means for repetitively and incrementally generating a complete cycle of the musical waveform under the control of a second clocking signal wherein each cycle of the musical waveform has an amplitude determined by the envelope waveform said second charge pump means including a charge storing means for accumulating discrete units of charge to produce time sequential discrete amplitude levels that together form a cycle of said waveform.

2. The instrument of claim 1 wherein said envelope waveform comprises a series of amplitude pulses, and wherein said tone generator means incrementally transfers the amplitude of each pulse to the tone generator means output under the control of the second clocking signal.

3. In an electronic musical instrument, a waveform and envelope generation circuit comprising:

means for producing a keying signal for calling forth a desired musical waveform, envelope generator means responsive to said keying signal for producing on an output an envelope waveform, said envelope generator means having an input connected to said keying signal and charge pump means for incrementally transferring voltage on said input to said output under the control of a first clocking signal connected to said envelope generator means, and tone generator means having an input operatively connected to the envelope generator means output and responsive to the envelope waveform for producing on a further output a cyclic musical waveform having an envelope following the envelope waveform, said tone generator means comprising second charge pump means for repetitively and incrementally generating a complete cycle of the musical waveform under the control of a second clocking signal wherein each cycle of the musical waveform has an amplitude determined by the envelope waveform, said keying signal being a DC voltage and said envelope generator charge pump means comprising a pair of electronic gates connected in series with each other and with said envelope generator means input and output, a first capacitor connected to the juncture of said gates, a second capacitor connected to the output of said envelope generator means, and means connected to the first clocking signal and to said gates for alternately rendering said gates conductive wherein charge is incrementally transferred between said input and output through said first capacitor.

4. The instrument of claim 1 wherein said envelope waveform comprises a series of amplitude pulses, and wherein said tone generator means incrementally transfers the amplitude of each pulse to the tone generator means output under the control of the second clocking signal.

5. The instrument of claim 4 wherein the second clocking signal always has a frequency much higher than the frequency of the amplitude pulses.

6. The instrument of claim 5 wherein the frequency of the second clocking signal changes at least once during each said amplitude pulse of the envelope waveform.

7. The instrument of claim 3 wherein said tone generator charge pump means comprises a second pair of electronic gates connected in series with each other and with the tone generator input and output, a third capacitor connected to the juncture of the second pair of gates, a fourth capacitor connected to the output of said tone generator means, and means connected to the second clocking signal and to said second pair of gates for alternately rendering said second pair of gates conductive whereby charge is incrementally transferred between said tone generator input and output through said third capacitor.

8. In an electronic musical instrument, a waveform and envelope generation circuit comprising:

means for producing a keying signal for calling forth a desired musical waveform, envelope generator means responsive to said keying signal for producing on an output an envelope waveform, said envelope generator means having an input connected to said keying signal and charge pump means for incrementally transferring voltage on said input to said output under the control of a first clocking signal connected to said envelope generator means, and tone generator means having an input operatively connected to the envelope generator means output and responsive to the envelope waveform for producing on a further output a cyclic musical waveform having an envelope following the envelope waveform, said tone generator means comprising second charge pump means for repetitively and incrementally generating a complete cycle of the musical waveform under the control of a second clocking signal wherein each cycle of the musical waveform has an amplitude determined by the envelope waveform, said envelope waveform comprises a series of amplitude pulses, and wherein said tone generator means incrementally transfers the amplitude of each pulse to the tone generator means output under the control of the second clocking signal, said tone generator means including means for transferring the amplitude of each amplitude pulse of the envelope waveform as a plurality of interconnected segments, each segment comprising a plurality of discrete musical waveform steps, and wherein the magnitude of the rate of change of slope of the resultant musical waveform for each said segment differs from the magnitude of the rate of change of slope for another said segment.

9. The instrument of claim 8 wherein the second clocking signal has a frequency higher than the series of pulses and the second clocking signal has a different frequency for different said segments.

10. The instrument of claim 8 wherein the resultant musical waveform is a sine wave and each half cycle thereof comprises three said segments.

11. The instrument of claim 8 wherein said tone generator means comprises means for counting the number of steps in each segment and selecting a different said second clocking frequency when a predetermined number of steps have been counted.

12. The instrument of claim 8 including filter means for smoothing out the discrete steps in the musical waveform, said filter means comprising tracking means synchronized by said second clocking signal for tracking said filter means to said second clocking signal.

13. The instrument of claim 12 wherein said filter means comprises a switched capacitor filter driven by said second clocking signal.

14. In an electronic musical instrument, a waveform and envelope generation circuit comprising:
means for producing a keying signal for calling forth a desired musical waveform,
envelope generator means responsive to said keying signal for producing on an output an envelope waveform, said envelope generator means having an input connected to said keying signal and charge pump means for incrementally transferring voltage on said input to said output under the control of a first clocking signal connected to said envelope generator means, and
tone generator means having an input operatively connected to the envelope generator means output and responsive to the envelope waveform for producing on a further output a cyclic musical waveform having an envelope following the envelope waveform, said tone generator means comprising second charge pump means for repetitively and incrementally generating a complete cycle of the musical waveform under the control of a second clocking signal wherein each cycle of the musical waveform has an amplitude determined by the envelope waveform,
said tone generator charge pump means comprising a pair of electronic gates connected in series with each other and with the tone generator input and output, a first capacitor connected to the juncture of the pair of gates, a second capacitor connected to the output of the tone generator means, and means connected to the second clocking signal and to said second pair of gates for alternately rendering said second pair of gates conductive whereby charge is incrementally transferred between said tone generator input and output through said second capacitor.

15. In an electronic musical instrument, a waveform and envelope generation circuit comprising:
means for producing a keying signal for calling forth a desired musical waveform,
envelope generator means responsive to said keying signal for producing on an output an envelope waveform, said envelope generator means having an input connected to said keying signal and charge pump means for incrementally transferring voltage on said input to said output under the control of a first clocking signal connected to said envelope generator means, and
tone generator means having an input operatively connected to the envelope generator means output and responsive to the envelope waveform for producing on a further output a cyclic musical waveform having an envelope following the envelope waveform, said tone generator means comprising second charge pump means within repetitively and incrementally generating a complete cycle of the musical waveform under the control of a second clocking signal wherein each cycle of the musical waveform has an amplitude determined by the envelope waveform and comprises a plurality of segments,
said means for producing a keying signal is a rhythm generator, said keying signal is a rhythmically occurring pulse, and said musical waveform is a damped bipolar sine wave, said tone generator means causes the magnitude of the rate of change of slope of the resultant musical waveform portion for each segment to be different than the magnitude of the rate of change of slope of another segment.

16. In an electronic musical instrument, a waveform and envelope generation circuit comprising:
means for producing a keying signal,
envelope generator means responsive to said keying signal for producing on an output a series of pulses having respective amplitudes that follow a time varying envelope, and
tone generator means for generating a plurality of cycles of a waveform having an input connected to said envelope generator output and having a charge transfer means for incrementally transferring the amplitude of each pulse to its output under the control of a first clocking signal whereby the pulse at the input of the tone generator means is shaped into at least a portion of one cycle of the musical waveform, the amplitude of the musical waveform following the time varying envelope,
said portion of a musical waveform comprising a plurality of interconnected segments each comprising a plurality of discrete amplitude steps, said first clocking signal having different frequencies pertaining to different segments.

17. The instrument of claim 16 wherein said tone generator means shapes the input pulses into a sine wave.

18. The instrument of claim 16 wherein the musical waveform produced by said tone generator means is a bipolar damped sine wave having an envelope which follows said time varying envelope.

19. The instrument of claim 16 wherein said keying signal is a rhythmically occurring pulse and said envelope generator means includes means responsive to the duration of said rhythmically occurring pulse to control the duration of said envelope.

20. The instrument of claim 16 wherein said envelope generator means comprises means for producing a positive going waveform and means simultaneously for producing a negative going waveform, and means for alternately selecting the positive going waveform and the negative going waveform at a given frequency rate to thereby produce said series of pulses.

21. The instrument of claim 20 wherein said given frequency rate is of a frequency much lower than said first clocking signal.

22. The instrument of claim 16 wherein the resultant musical waveform is a sine wave and each half cycle thereof comprises three said segments.

23. The instrument of claim 16 wherein said tone generator means comprises means for counting the number of steps in each segment and selecting a different said first clocking frequency when a predetermined number of steps have been counted.

24. The instrument of claim 16 including filter means connected to said tone generator means for smoothing out the discrete steps in the musical waveform, said filter means comprising tracking means synchronized with said first clocking signal to track said filter means to said first clocking signal.

25. In an electronic musical instrument, a waveform and envelope generation circuit comprising:
   means for producing a keying signal for calling forth a desired musical waveform,
   envelope generator means responsive to said keying signal for producing on an output an envelope waveform, said envelope generator means having an input connected to said keying signal and charge pump means for incrementally transferring voltage on said input to said output under the control of a first clocking signal connected to said envelope generator means, and
   tone generator means having an input operatively connected to the envelope generator means output and responsive to the envelope waveform for producing on a further output a cyclic musical waveform having an envelope following the envelope waveform, said tone generator means comprising second charge pump means for repetitively and incrementally generating a complete cycle of the musical waveform under the control of a second clocking signal wherein each cycle of the musical waveform has an amplitude determined by the envelope waveform,
   said envelope waveform comprising a series of amplitude pulses, said tone generator means including means incrementally for transferring the amplitude of each pulse to the tone generator means output under the control of the second clocking signal, said second clocking signal having a frequency always higher than the frequency of the amplitude pulses, and the frequency of the second clocking signal changing at least once during each amplitude pulse of the envelope waveform.

26. In an electronic musical instrument, a method for producing a tone of desired frequency and having a given amplitude envelope comprising:
   generating a keying signal,
   incrementally producing a time varying envelope waveform in response to the keying signal wherein the envelope signal comprises a plurality of amplitude steps collectively following the given amplitude envelope,
   producing a musical waveform in response to the steps of the envelope waveform by incrementally generating a plurality of musical waveform amplitude steps in response to each step of the envelope waveform, the resulting musical waveform comprising a plurality of cycles wherein each cycle comprises a plurality of segments each comprising a plurality of discrete amplitude steps and follows the given amplitude envelope,
   varying the frequency at which the discrete amplitude steps occur within each cycle of the musical waveform such that the discrete amplitude steps for one segment of each musical waveform cycle occur at a different frequency than the discrete amplitude steps for another segment of the musical waveform cycle, and
   smoothing out the discrete amplitude steps.

27. The method of claim 26 wherein the envelope waveform is produced by simultaneously producing a positive going waveform and a negative going waveform and then alternately switching between the positive and negative going waveforms at a first frequency to produce a series of bipolar pulses, the amplitudes of the pulses increasing during an attack portion and decreasing during a subsequent decay portion of the envelope waveform.

28. The method of claim 27 wherein the musical waveform comprises a series of sine wave half cycles occurring with the same frequency as the pulses, and the musical waveform is a damped sine wave.

29. The method of claim 26 including counting the number of discrete steps in each segment and changing the frequency at which the discrete steps occur when a predetermined number of steps have been counted.

30. An electronic musical instrument for producing a tone a desired frequency and having a given amplitude envelope comprising:
   means for generating a keying signal,
   means incrementally for producing a time varying envelope waveform in response to the keying signal wherein the envelope signal comprises a plurality of amplitude steps collectively following the given amplitude envelope,
   means for producing a musical waveform in response to the steps of the envelope waveform by incrementally generating a plurality of musical waveform amplitude steps in response to each step of the envelope waveform, the resulting musical waveform comprising a plurality of cycles wherein each cycle comprises a plurality of segments each comprising a plurality of discrete amplitude steps and follows the given amplitude envelope,
   means for varying the frequency at which the discrete amplitude steps occur within each cycle of the musical waveform such that the discrete amplitude steps for one segment of each musical waveform cycle occur at a different frequency than the discrete amplitude steps for another segment of the musical waveform cycle, and
   filter means for smoothing out the discrete amplitude steps.

31. The musical instrument of claim 30 wherein said means for producing a musical waveform comprises means simultaneously for producing a positive going waveform and a negative going waveform and then alternately switching between the positive and negative going waveforms at a first frequency to produce a series of bipolar pulses, the amplitudes of the pulses increasing during an attack portion and decreasing during a subsequent decay portion of the envelope waveform.

32. The musical instrument of claim 31 wherein the musical waveform comprises a series of sine wave half cycles occurring with the same frequency as the pulses, and the musical waveform is a damped sine wave.

33. The musical instrument of claim 30 including means for counting the number of discrete steps in each segment and changing the frequency at which the discrete steps occur when a predetermined number of steps have been counted.

* * * * *